(12) United States Patent
Okamoto et al.

(10) Patent No.: US 8,525,229 B2
(45) Date of Patent: Sep. 3, 2013

(54) SEMICONDUCTOR DEVICE

(75) Inventors: Yasuhiro Okamoto, Tokyo (JP); Yuji Ando, Tokyo (JP); Takashi Inoue, Tokyo (JP); Tatsuo Nakayama, Tokyo (JP); Hironobu Miyamoto, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 974 days.

(21) Appl. No.: 12/299,542

(22) PCT Filed: May 7, 2007

(86) PCT No.: PCT/JP2007/000482
§ 371 (c)(1),
(2), (4) Date: Nov. 4, 2008

(87) PCT Pub. No.: WO2007/129471
PCT Pub. Date: Nov. 15, 2007

(65) Prior Publication Data
US 2010/0230684 A1 Sep. 16, 2010

(30) Foreign Application Priority Data
May 8, 2006 (JP) ................................ 2006-129322

(51) Int. Cl.
*H01L 29/205* (2006.01)
*H01L 29/778* (2006.01)
(52) U.S. Cl.
USPC ...... 257/194; 257/96; 257/185; 257/E29.091; 257/E29.315

(58) Field of Classification Search
USPC .................. 257/192–194, E29.091, E29.315
See application file for complete search history.

(56) References Cited

U.S. PATENT DOCUMENTS

| 6,046,464 A * | 4/2000 | Schetzina .................. 257/96 |
| 6,090,649 A | 7/2000 | Suemitsu et al. |
| 2001/0040247 A1 | 11/2001 | Ando et al. |
| 2005/0006664 A1 * | 1/2005 | Inoue et al. .................. 257/192 |

FOREIGN PATENT DOCUMENTS

| JP | 10-209434 | 8/1998 |
| JP | 2001-274375 | 10/2001 |
| JP | 2002-289837 | 10/2002 |

OTHER PUBLICATIONS

O Ambacher et al., "Pyroelectric properties of Al(In)GaN/GaN hetero- and quantum well structures", Institute of Physics Publishing, Journal of Physics: Condensed Matter.

* cited by examiner

*Primary Examiner* — Ha Tran T Nguyen
*Assistant Examiner* — Raj R Gupta
(74) *Attorney, Agent, or Firm* — Young & Thompson

(57) ABSTRACT

A semiconductor device includes a channel layer, an electron-supplying layer provided on the channel layer, a cap layer provided on the electron-supplying layer and creating lattice match with the channel layer, and ohmic electrodes provided on the cap layer. The cap layer has a composition of $(In_yAl_{1-y})_zGa_{1-z}N$ ($0 \leq y \leq 1$, $0 \leq z \leq 1$). The z for such cap layer monotonically decreases as being farther away from the electron-supplying layer.

46 Claims, 9 Drawing Sheets (a)

(b)

(a)

(b)

OHMIC ELECTRODE | CAP LAYER | ELECTRON-SUPPLYING LAYER | CHANNEL LAYER (a)

(b)

OHMIC ELECTRODE | CAP LAYER | ELECTRON-SUPPLYING LAYER | CHANNEL LAYER (a)

(b)

OHMIC ELECTRODE    CAP LAYER    ELECTRON-SUPPLYING LAYER    CHANNEL LAYER (a) Related Art (b) Related Art

OHMIC ELECTRODE | CAP LAYER | ELECTRON-SUPPLYING LAYER | CHANNEL LAYER

SEMICONDUCTOR DEVICE

TECHNICAL FIELD

The present invention relates to a semiconductor device including a group III nitride semiconductor layer and an ohmic electrode that creates an ohmic contact with such semiconductor layer.

BACKGROUND ART

FIG. 9(a) is a cross-sectional view, showing a schematic configuration of a hetero-junction field effect transistor (hereinafter referred to as HJFET) according to a conventional technology, which is typically described in Patent Document 1. A gallium nitride (GaN) channel layer 102 and an aluminum gallium nitride (AlGaN) electron-supplying layer 103 are consecutively formed on a substrate 100. The electron-supplying layer 103 creates no lattice match with the GaN channel layer 102, and thus a growth thereof to a sufficient thickness for avoiding an influence of the surface cannot be achieved. Therefore, an n-type indium aluminum gallium nitride (InAlGaN) cap layer 104, which is capable of creating lattice match with the GaN channel layer 102, is employed to coat over an upper surface of the electron-supplying layer 103.

A gate electrode 105 is formed in a concave portion provided in the cap layer 104 so as to be in contact with the electron-supplying layer 103. A source electrode 106 and a drain electrode 107 are formed on the cap layer 104. In this structure, InAlN ratio in the n-type InAlGaN cap layer 104 is selected to be 1.5 times or more of the AlN ratio in the electron-supplying layer 103, so that polarized charge in the cap layer 104 is not lower than polarized charge in the electron-supplying layer 103. This results in reduced potential barrier between the cap layer 104 and the electron-supplying layer 103, achieving a reduction of the ohmic resistance.

FIG. 9(b) is a diagram of energy band, showing a conduction band energy distribution corresponding to the ohmic contact of FIG. 9(a). Ordinate represents energy and abscissa represents depth. Abscissa in the left side represents the ohmic electrode, and the right side represents the channel layer. A depleted layer extends over an interface of the semiconductor that is in contact with the electrode, creating a potential barrier for electron.

In addition to above, prior art literatures related to the present invention also includes Non-Patent Document 1, in addition to Patent Document 1.
[Patent Document 1]
Japanese Patent Laid-Open No. 2002-289,837
[Non-Patent Document 1]
Ambacher et al., J. Phys.: Condense Matter, Vol. 14, Page 3399.

DISCLOSURE OF THE INVENTION

In the conventional semiconductor device described above, the InAlGaN layer is employed for the cap layer to provide further inhibited potential barrier between the cap layer and the electron-supplying layer, as compared with the configuration employing the GaN layer for the cap layer. On the other hand, however, this also results in an increased potential barrier between the ohmic electrode and the cap layer, and thus sufficiently reduced contact resistance cannot be achieved.

According to one exemplary aspect of the present invention, there is provided a semiconductor device, including: a channel layer; an electron-supplying layer provided on the channel layer; a cap layer, provided on the electron-supplying layer and creating lattice match with the channel layer; and an ohmic electrode provided on the cap layer, wherein the cap layer has a composition of: $(In_yAl_{1-y})_zGa_{1-z}N$ where ($0 \leq y \leq 1$, $0 \leq z \leq 1$), and z for the cap layer monotonically decreases as being farther away from the electron-supplying layer.

In such semiconductor device, the cap layer creates lattice match with the channel layer. Further, a value of z in the composition of the cap layer decreases as being farther away from the electron-supplying layer, or in other words, decreases toward the side of the ohmic electrode from the side of the electron-supplying layer. Such configuration is employed for the cap layer that creates an ohmic contact so that potential barrier between the ohmic electrode and the cap layer can be reduced as discussed later, which allows sufficiently reducing the contact resistance.

In addition to above, z of the cap layer is not required to be decreased at a constant gradient. For example, such z may be decreased at varied gradient, or may be stepwise decreased.

According to one exemplary aspect of the present invention, a semiconductor device having sufficiently lower contact resistance is achieved.

BRIEF DESCRIPTION OF THE DRAWINGS

The above-mentioned object, other objects, features, and advantages will become more apparent from exemplary embodiments explained below by reference to the attached drawings.

FIG. 2(b) is a diagram of energy band, showing a distribution of conduction band energy corresponding to ohmic contact shown in FIG. 2(a).

EXEMPLARY EMBODIMENT

Exemplary embodiments of the present invention will be described below, in reference to the annexed figures. In all figures, an identical numeral is assigned to an element commonly appeared in the figures, and the detailed description thereof will not be repeated.

First Exemplary Embodiment

Figure 1:
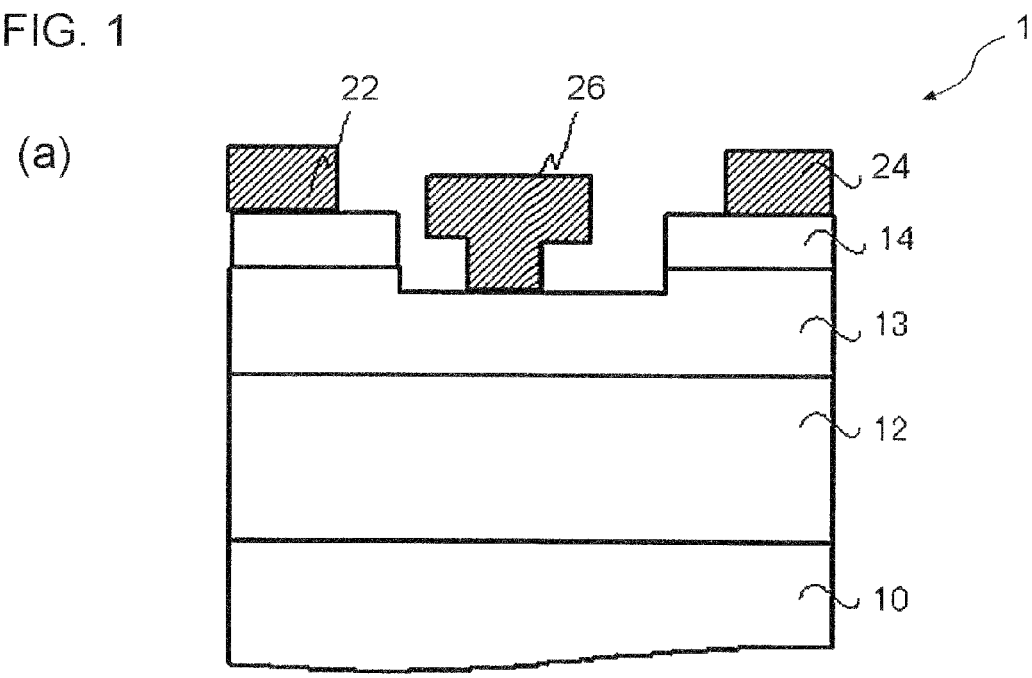
FIG. 1(a) is a cross-sectional view, illustrating first exemplary embodiment of a semiconductor device according to the present invention.
FIG. 1(b) is a diagram of energy band, showing a distribution of conduction band energy corresponding to ohmic contact shown in FIG. 1(a).
Figure 1:
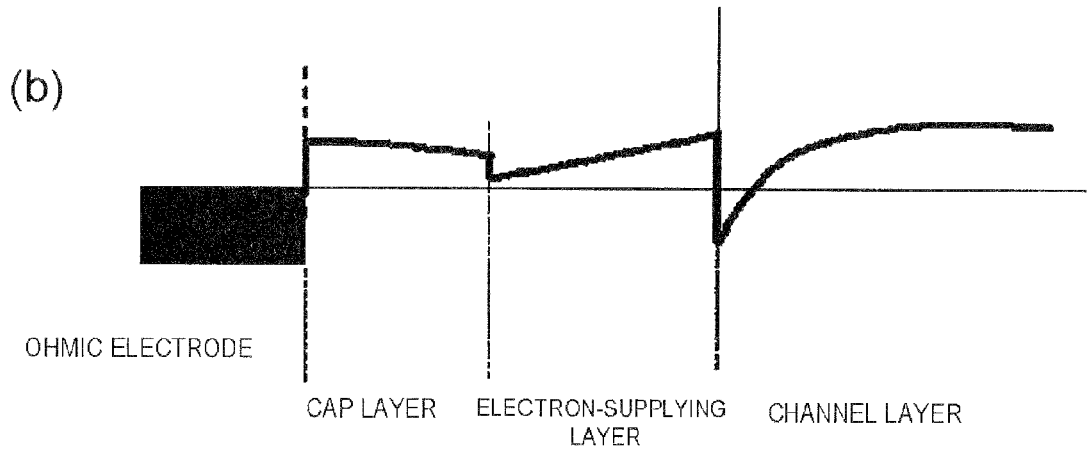

FIG. 1(a) is a cross-sectional view, illustrating first exemplary embodiment of a semiconductor device according to the present invention. A semiconductor device 1 includes a channel layer 12, an electron-supplying layer 13 provided on the channel layer 12, a cap layer 14 provided on the electron-supplying layer 13 and creating lattice match with the channel layer 12, and ohmic electrodes 22 and 24 provided on the cap layer 14.

The channel layer 12 is formed over the substrate 10 such as SiC and the like through a buffer layer, which is not shown here. The channel layer 12 has a composition of GaN or $In_tGa_{1-t}N$ ($0<t\leq 1$). The electron-supplying layer 13 has a composition of $Al_xGa_{1-x}N$ ($0<x\leq 1$).

The cap layer 14 has a composition of $(In_yAl_{1-y})_zGa_{1-z}N$ ($0\leq y\leq 1$, $0\leq z\leq 1$). The "z" for such cap layer 14 monotonically decreases as being farther away from the electron-supplying layer 13. More specifically, in the cap layer 14, ratio of InAlN is decreased from the side of the electron-supplying layer 13 toward the side of the ohmic electrodes 22 and 24, while maintaining lattice match with the channel layer 12. In particular, in the present exemplary embodiment, the composition of the cap layer 14 is GaN (the above-described z=0) at the interface with the ohmic electrodes 22 and 24.

Portions of the cap layer 14 and the electron-supplying layer 13 are removed, and the gate electrode 26 creates a Schottky contact with the electron-supplying layer 13 through a concave portion formed by such removal. Such gate electrode 26 constitutes an HJFET with the channel layer 12, the electron-supplying layer 13 and the cap layer 14. The above-described ohmic electrode 22 and ohmic electrode 24 function as a source electrode and a drain electrode of the HJFET, respectively. The ohmic electrodes 22 and 24 create ohmic contacts with the cap layer 14.

FIG. 1(b) is a diagram of energy band, showing a distribution of conduction band energy corresponding to ohmic contact shown in FIG. 1(a). Ordinate represents energy and abscissa represents depth. Abscissa in the left side represents the ohmic electrode, and the right side represents the channel layer. The ohmic contact in the present exemplary embodiment is obtained by electron in the electrode metal, which exceeds the potential barrier at the electrode-semiconductor interface to reach the cap layer 14. The potential barrier at the electrode-semiconductor interface depends on type of the electrode metal and y and z in the composition of the cap layer 14.

Here, the band gap is represented by Eg, the potential barrier for nickel (Ni) is represented by $\Phi_B$, the spontaneous polarized charge of the cap layer 14 is represented by $P^{sp}$, and the piezo polarized charge for GaN is represented by $P^{pz}$.

According to the above-described Non-patent Document 1, composition dependencies of Eg, $\Phi_B$, $P^{sp}$ and $P^{pz}$ are as follows:

$$Eg=3.42+2.71z-9.58yz+5.4y^2z(\text{eV}) \quad (1),$$

$$\Phi_B=0.84+1.30z-1.66yz(\text{eV}) \quad (2),$$

$$P^{sp}=-0.034-0.056z+0.118yz-0.070y^2z(\text{Cm}^{-2}) \quad (3),$$

$$P^{pz}=[-0.0525(1-y)+0.148y+0.0938y(1-y)]z(\text{Cm}^{-2}) \quad (4).$$

According to formula (4), a condition for creating no piezo polarized charge due to the lattice match with GaN is presented as: y=0.19. The band gap and the potential barrier in such case are presented from formula (1) and formula (2), respectively, as:

$$Eg=3.42+1.08z(\text{eV}) \quad (5),$$

$$\Phi_B=0.84+0.98z(\text{eV}) \quad (6).$$

Here, the potential barriers of the cap layer and the ohmic metal are considered as parameters indicative for the contact resistances. While the potential barrier for Ni is represented in formula (6), other metallic materials having smaller work function may be generally employed for the ohmic electrode for the purpose of obtaining further reduced potential barrier. However, since the potential barrier is correlated with a work function of a metal, aluminum (Al), which is generally employed for the ohmic electrode, also exhibits similar tendency, when the potential barrier for Ni is considered.

While the range of x in the composition $Al_xGa_{1-x}N$ of the electron-supplying layer is $0<x\leq 1$, the range may be preferably $0.1\leq x\leq 0.3$. Here, an exemplary implementation of x=0.2 will be described. Since z of the cap layer is presented as 0.3 when a condition of x=0.2 is employed according to the conventional technology, the potential barrier is obtained as 1.13 eV by formula (6). On the other hand, since the top of the cap layer is GaN (in other words, z=0) according to the present exemplary embodiment, the potential barrier can be considerably reduced to 0.84 eV. This allows effectively reducing the ohmic resistance according to the present exemplary embodiment. While the exemplary implementation employing GaN for the top of the cap layer has been described here, a reduced ohmic resistance can also be achieved if z is within a range that provides smaller potential barrier than the AlGaN electron-supplying layer, even though z>0.

Second Exemplary Embodiment

Figure 2:
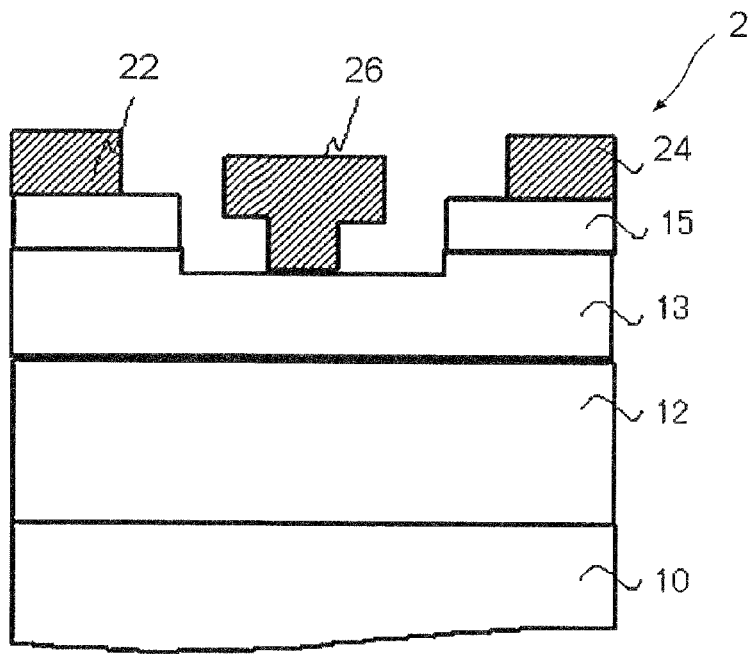
FIG. 2 (a) is a cross-sectional view, illustrating second exemplary embodiment of a semiconductor device according to the present invention.
Figure 2:
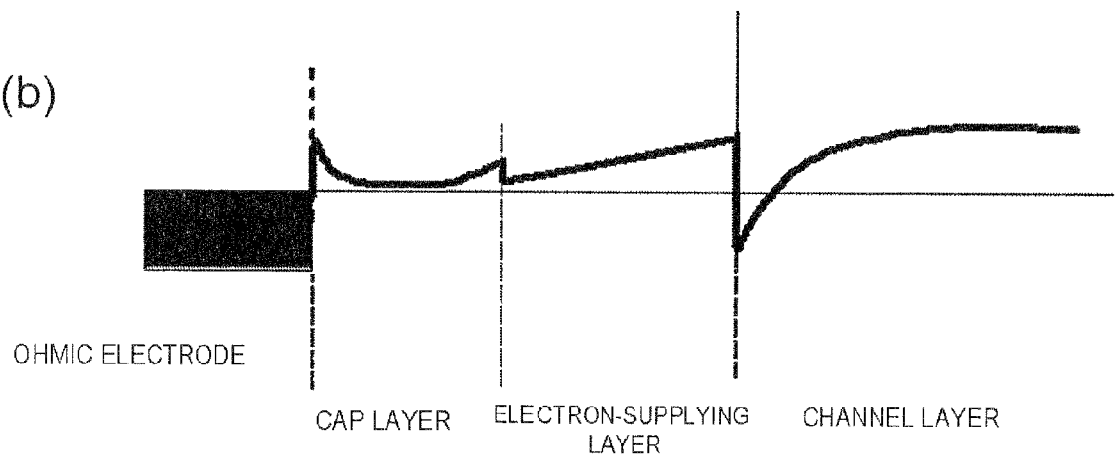

FIG. 2(a) is a cross-sectional view, illustrating second exemplary embodiment of a semiconductor device according to the present invention. In a semiconductor device 2, a cap layer 15 is employed in place of the cap layer 14 in the semiconductor device 1 shown in FIG. 1(a). Other configurations of the semiconductor device 2 are similar to that of the semiconductor device 1.

The cap layer 15 is doped with n-type dopant, which creates negative charge that is larger than a spontaneous polarized charge. Other configurations of the cap layer 15 are similar to that of the cap layer 14. More specifically, the cap layer 15 also has a composition of: $(In_yAl_{1-y})_zGa_{1-z}N$ ($0\leq y\leq 1$, $0\leq z\leq 1$), and z monotonically decreases as being away from the electron-supplying layer 13. Further, the cap layer 15 creates lattice match with the channel layer 12.

The doping concentration in such case may be designed as follows. Spontaneous polarized charge in the cap layer 15 is presented by substituting y=0.19, which is a condition for lattice match with the GaN layer, into formula (3) to obtain:

$$P^{sp}=-0.034-0.036z(\text{Cm}^{-2}) \quad (7).$$

Spontaneous polarized charge for z ranging from $z_1$ to 0 is obtained by an integration of formula (7) as:

$$P^{sp}=-0.034z_1-0.018z_1^2 (Cm^{-2}) \quad (8).$$

In an example assuming z=0.5, it is obtained:

$$P^{sp}=0.022\ Cm^{-2}(1.34\times10^{13}\ cm^{-2}).$$

When the thickness of the cap layer 15 is assumed to be 50 nm, this corresponds to $2.68\times10^{18}\ cm^{-3}$. A potential distribution of a convex profile from above downward as shown in FIG. 2(b) is obtained by doping with n-type dopant at a concentration higher than the above-described concentration, so that better ohmic-ability can be achieved. Here, FIG. 2(b) is a diagram of energy band, showing a distribution of conduction band energy corresponding to ohmic contact shown in FIG. 2(a). Ordinate represents energy and abscissa represents depth. Abscissa in the left side represents the ohmic electrode, and the right side represents the channel layer.

Third Exemplary Embodiment

Figure 3:
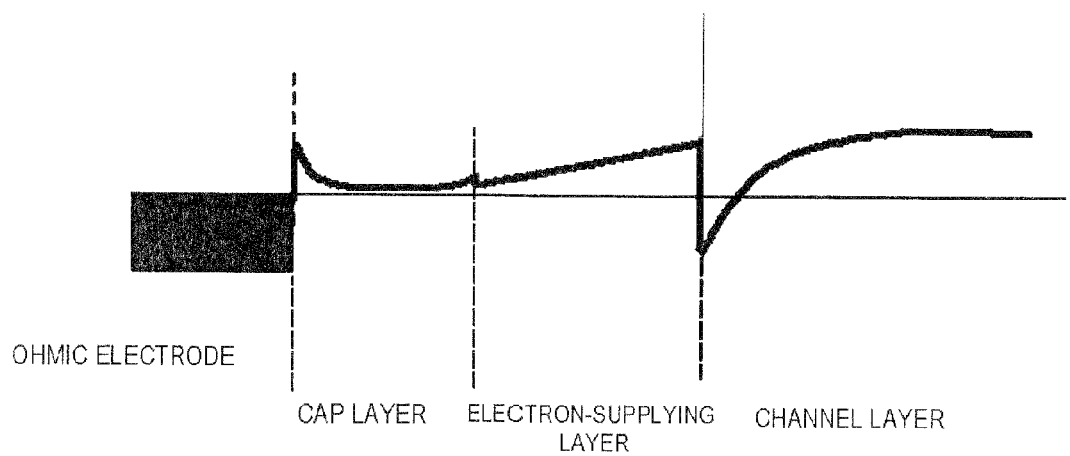
FIG. 3 is a diagram of energy band, showing a distribution of conduction band energy corresponding to ohmic contact in third exemplary embodiment.

FIG. 3 is a diagram of energy band, showing a distribution of conduction band energy corresponding to ohmic contact in third exemplary embodiment. Ordinate represents energy and abscissa represents depth. Abscissa in the left side represents the ohmic electrode, and the right side represents the channel layer. The present exemplary embodiment is configured that the composition of the cap layer 15 in second exemplary embodiment is selected to provide a valence band discontinuity that is not higher than a predetermined level at the interface with the electron-supplying layer 13. Having such configuration, a potential barrier from the cap layer 15 to the electron-supplying layer 13 is decreased, thereby providing a reduced ohmic resistance.

Here, z in the composition $(In_yAl_{1-y})_zGa_{1-z}N$ of the cap layer 15 in such case may be designed as follows. The band gap of the electron-supplying layer 13 is obtained by assigning the values of: Y=0 and Z=x, into formula (1) as:

$$Eg=3.42+2.71x+x^2 (eV) \quad (9).$$

On the other hand, according to the above-described Non-Patent Document 1, the valence band discontinuity $\Delta Ec$ is presented as:

$$\Delta Ec=0.63(Eg1-Eg2)(eV) \quad (10).$$

Therefore, the valence band discontinuity of the cap layer 15 and the electron-supplying layer 13 is obtained as:

$$\Delta Ec=0.63(2.71x+x^2-1.08z)(eV) \quad (11),$$

where k, $T_{ch}$ and Q are assigned to the Boltzmann constant, the channel temperature and the elementary charge, respectively. A valence band discontinuity of not higher than $(kT_{ch}/q)$ (eV) provides no influence over the nature of the electron transfer between the cap layer 15 and the electron-supplying layer 13. Therefore, the following relation is achieved:

$$-kT_{ch}/q \leq 0.63(2.71x+x^2-1.08z) \leq kT_{ch}/q \quad (12).$$

When a condition of X=0.2 and a channel temperature of 200 degree C. are assumed, the range of z is obtained as $0.48 \leq z \leq 0.6$. If z is within the above range, a potential barrier between the cap layer 15 and the electron-supplying layer 13 can be eliminated, so that the ohmic resistance can be reduced. Further, the valence band discontinuity is reduced to zero in the case of z=0.54, and the spontaneous polarized charge in such case is obtained through formula (8) as 0.024 $Cm^{-2}$ ($1.50\times10^{13}\ cm^{-2}$), and this is equivalent to $3.00\times10^{18}\ cm^{-3}$ when the thickness of the cap layer is assumed to be 50 nm. A potential distribution of a convex profile from above downward is obtained by doping with n-type dopant at a concentration higher than the above-described concentration, so that better ohmic-ability can be achieved.

Fourth Exemplary Embodiment

Figure 4:
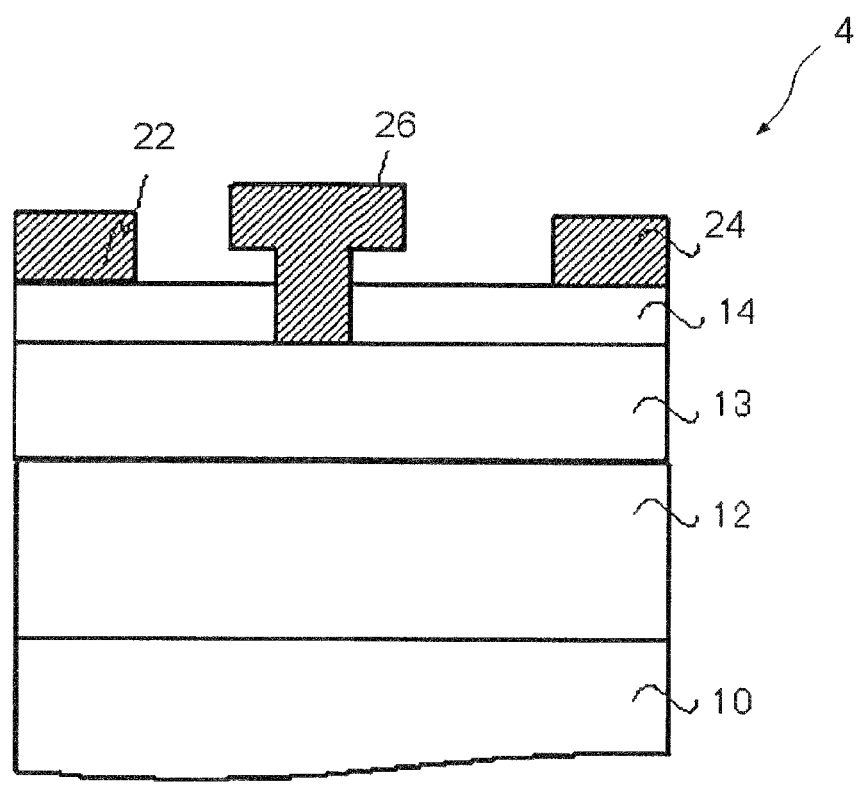
FIG. 4 is a cross-sectional view, illustrating fourth exemplary embodiment of a semiconductor device according to the present invention.

FIG. 4 is a cross-sectional view, illustrating fourth exemplary embodiment of a semiconductor device according to the present invention. In a semiconductor device 4, whole of a section in the upper surface of the electron-supplying layer 13 that is not coupled to the gate electrode 26 is covered with the cap layer 14. The cap layer 14 is also in contact with a side surface of the gate electrode 26. The cap layer 14 creates lattice match with the channel layer 12 and thus can be grown to have sufficient thickness, and therefore an effect for avoiding an influence of the surface can be achieved. In addition to above, in the present exemplary embodiment, a cap layer 15 [see FIG. 2(a)] may be employed instead of the cap layer 14.

Fifth Exemplary Embodiment

Figure 5:
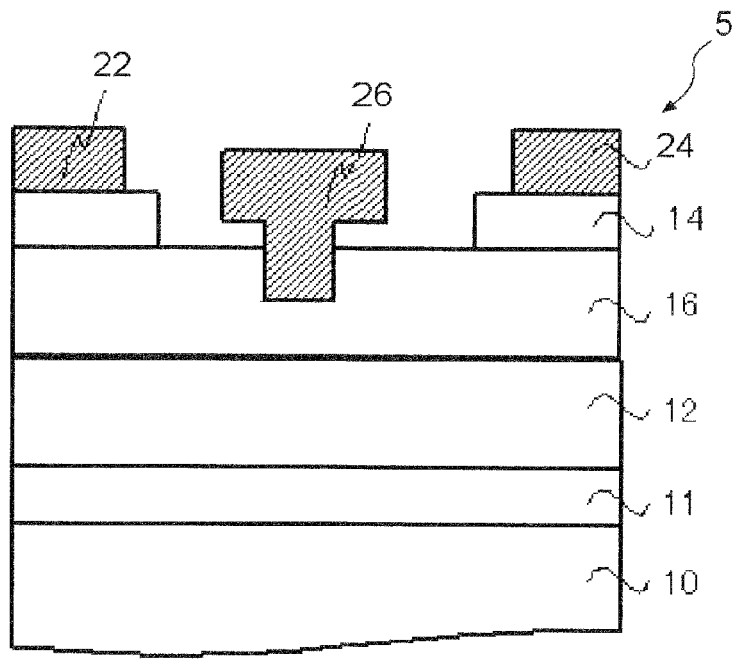
FIG. 5(a) is a cross-sectional view, illustrating fifth exemplary embodiment of a semiconductor device according to the present invention.
FIG. 5(b) is a diagram of energy band, showing a distribution of conduction band energy corresponding to ohmic contact shown in FIG. 5(a).
Figure 5:
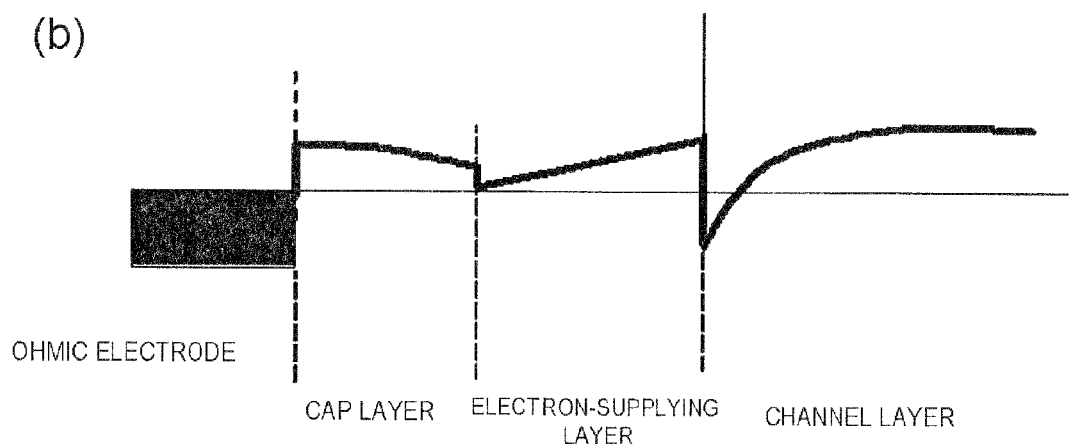

FIG. 5(a) is a cross-sectional view, illustrating fifth exemplary embodiment of a semiconductor device according to the present invention. A semiconductor device 1 includes a channel layer 12, an electron-supplying layer 16 provided on the channel layer 12, a cap layer 14 provided on the electron-supplying layer 16 and creating lattice match with both the channel layer 12 and the electron-supplying layer 16, and ohmic electrodes 22 and 24 provided on the cap layer 14.

The channel layer 12 is formed over the substrate 10 through a buffer layer 11. The electron-supplying layer 16 has a composition of $(In_uAl_{1-u})_xGa_{1-x}N$ ($0 \leq u \leq 1$, $0 < x \leq 1$). Portions of the cap layer 14 and the electron-supplying layer 16 are removed, and the gate electrode 26 creates a Schottky contact with the electron-supplying layer 16 through a concave portion formed by such removal. Such gate electrode 26 constitutes an HJFET with the channel layer 12, the electron-supplying layer 16 and the cap layer 14. The above-described ohmic electrode 22 and ohmic electrode 24 function as a source electrode and a drain electrode of the HJFET, respectively. The ohmic electrodes 22 and 24 create ohmic contacts with the cap layer 14.

In the present exemplary embodiment, the electron-supplying layer 16 creates lattice match with the channel layer 12. This prevents a creation of a piezo polarized charge, so that carrier is generated only with a spontaneous polarized charge. A sheet concentration of carrier is presented by subtracting spontaneous polarized charge of the channel layer 12 from sum of piezo polarized charge and spontaneous polarized charge in the electron-supplying layer 16, and thus is calculated by formula (3) and formula (4). In the electron-supplying layer 16, the carrier density is presented as: $1.31\times10^{-13}\ cm^{-2}$. In order to achieve a carrier density of the equivalent level, x in the electron-supplying layer 16 may be assigned as x=0.58 in formula (7).

FIG. 5(b) is a diagram of energy band, showing a distribution of conduction band energy corresponding to ohmic contact of FIG. 5(a). Ordinate represents energy and abscissa represents depth. Abscissa in the left side represents the ohmic electrode, and the right side represents the channel layer. Since the composition of the top portion of the cap layer 14 is also GaN in the present exemplary embodiment, a reduced potential barrier can be provided. Further, in the present exemplary embodiment, the electron-supplying layer 16 also creates lattice match with channel layer 12. Thus, sufficiently thicker electron-supplying layer 16 can be provided. Therefore, an influence of the surface can be avoided even though the whole section in the upper surface of the electron-supplying layer 16 that is not coupled to the gate electrode 26 is not covered with the cap layer 14. This allows the gate electrode 26 providing no contact with the n-type cap layer 14, and thus is advantageous in terms of breakdown voltage.

Sixth Exemplary Embodiment

Figure 6:
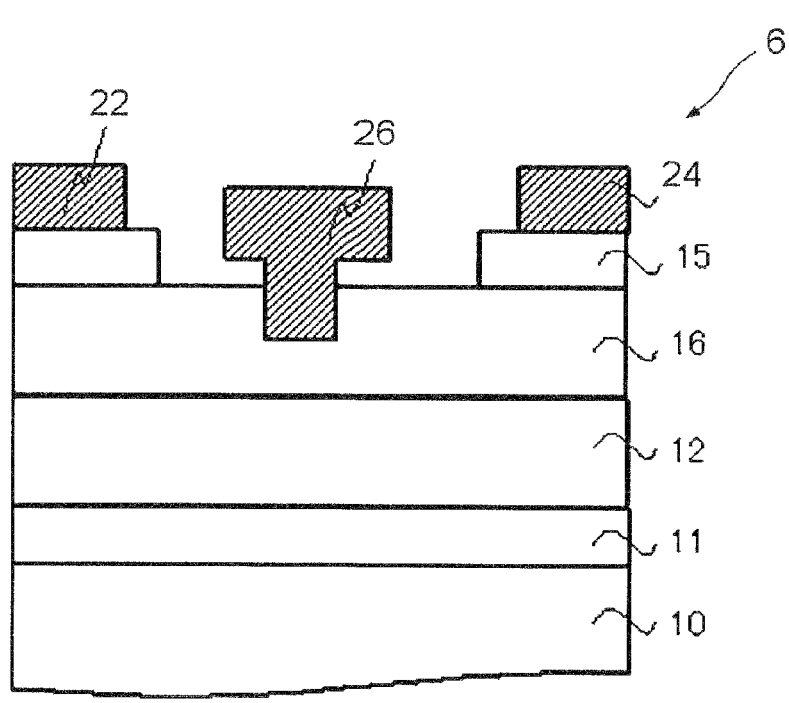
FIG. 6(a) is a cross-sectional view, illustrating sixth exemplary embodiment of a semiconductor device according to the present invention.
FIG. 6(b) is a diagram of energy band, showing a distribution of conduction band energy corresponding to ohmic contact shown in FIG. 6(a).
Figure 6:
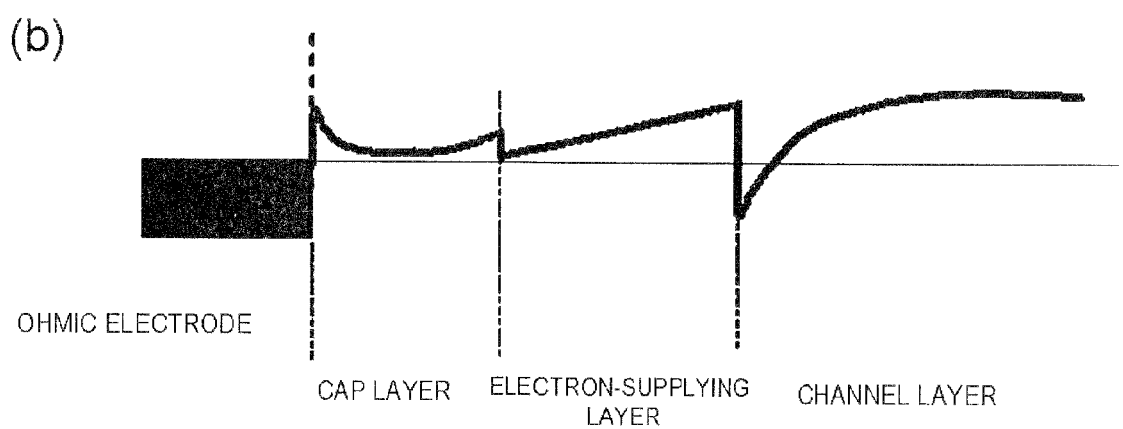

FIG. 6(a) is a cross-sectional view, illustrating sixth exemplary embodiment of a semiconductor device according to the present invention. FIG. 6(b) is a diagram of energy band, showing a distribution of conduction band energy corresponding to ohmic contact shown in FIG. 6(a). Ordinate represents energy and abscissa represents depth. Abscissa in the left side represents the ohmic electrode, and the right side represents the channel layer. In a semiconductor device 6, a cap layer 15 is employed in place of the cap layer 14 in the semiconductor device 5 shown in FIG. 5(a). Other configurations of the semiconductor device 6 are similar to that of the semiconductor device 5. The configuration of the cap layer 15 is the same as described in reference to FIG. 2(a).

In an example assuming z=0.54, it is obtained as: 0.024 Cm$^{-2}$ (1.50×10$^{13}$ cm$^{-2}$), and when the thickness of the cap layer is assumed to be 50 nm, this corresponds to 3.00×10$^{18}$ cm$^{-3}$. A potential distribution of a convex profile from above downward is obtained by doping with n-type dopant at a concentration higher than the above-described concentration, so that better ohmic-ability can be achieved.

Seventh Exemplary Embodiment

Figure 7:
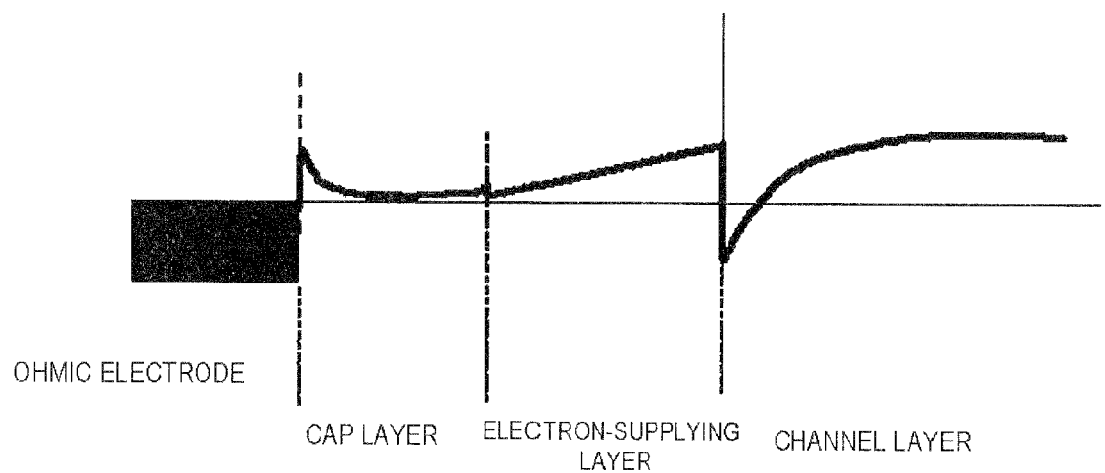
FIG. 7 is a diagram of energy band, showing a distribution of conduction band energy corresponding to ohmic contact in seventh exemplary embodiment.

FIG. 7 is a diagram of energy band, showing a distribution of conduction band energy corresponding to ohmic contact in seventh exemplary embodiment. Ordinate represents energy and abscissa represents depth. Abscissa in the left side represents the ohmic electrode, and the right side represents the channel layer. The present exemplary embodiment is configured that the composition of the cap layer 15 in sixth exemplary embodiment is modified so as to provide a valence band discontinuity that is not higher than a certain level at the interface with the electron-supplying layer 16. Having such configuration, a potential barrier from the cap layer 15 to the electron-supplying layer 16 is reduced, thereby providing a reduced ohmic resistance.

Here, z in the composition of the cap layer 15 in such case may be designed as follows. A valence band discontinuity in the electron-supplying layer 16 and the cap layer 15 is presented by utilizing a condition of u=y=0.19 and formula (1) and formula (10) as:

$$\Delta Ec = 0.68(x-z)(eV) \quad (13).$$

A valence band discontinuity of not higher than (kT$_{ch}$/q) (eV) provides no influence over the nature of the electron transfer between the cap layer 15 and the electron-supplying layer 16. Therefore, the following relation is achieved:

$$-kT_{ch}/q \leq 0.68(x-z) \leq kT_{ch}/q \quad (14).$$

Fifth exemplary embodiment is taken as an exemplary implementation and when conditions of x=0.58 and a channel temperature of 200 degree C. are assumed, the range of z is presented as: 0.52≦z≦0.64, and if z is within the above range, a potential barrier between the cap layer 15 and the electron-supplying layer 16 can be eliminated, so that the ohmic resistance can be reduced.

Eighth Exemplary Embodiment

Figure 8:
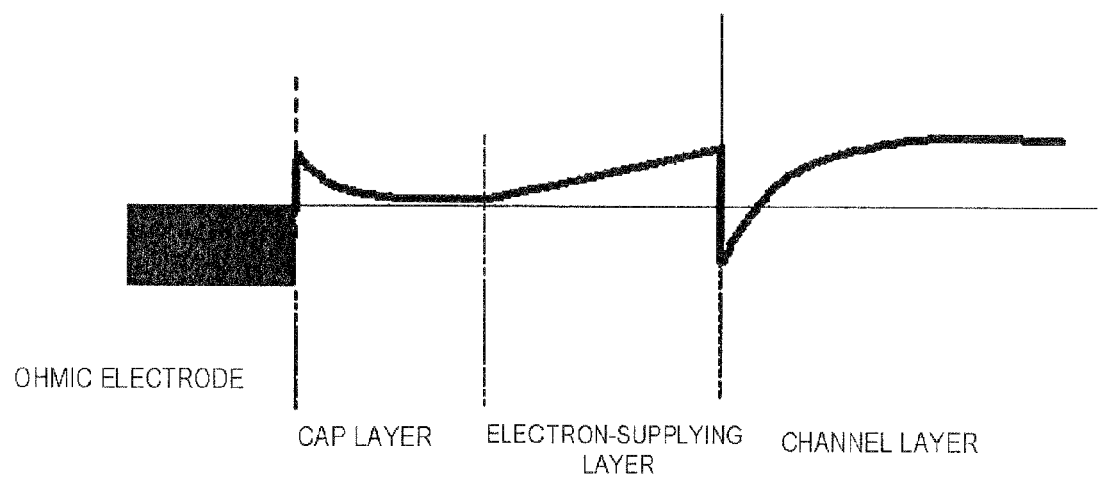
FIG. 8 is a diagram of energy band, showing a distribution of conduction band energy corresponding to ohmic contact in eighth exemplary embodiment.
Figure 9:
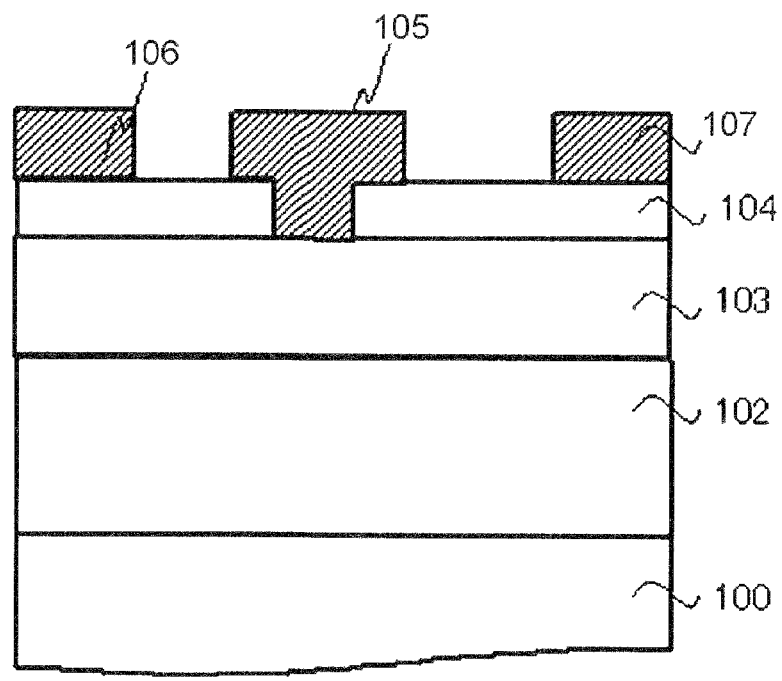
FIG. 9(a) is a cross-sectional view, illustrating a conventional semiconductor device.
FIG. 9(b) is a diagram of energy band, showing a distribution of conduction band energy corresponding to ohmic contact shown in FIG. 9(a).
Figure 9:
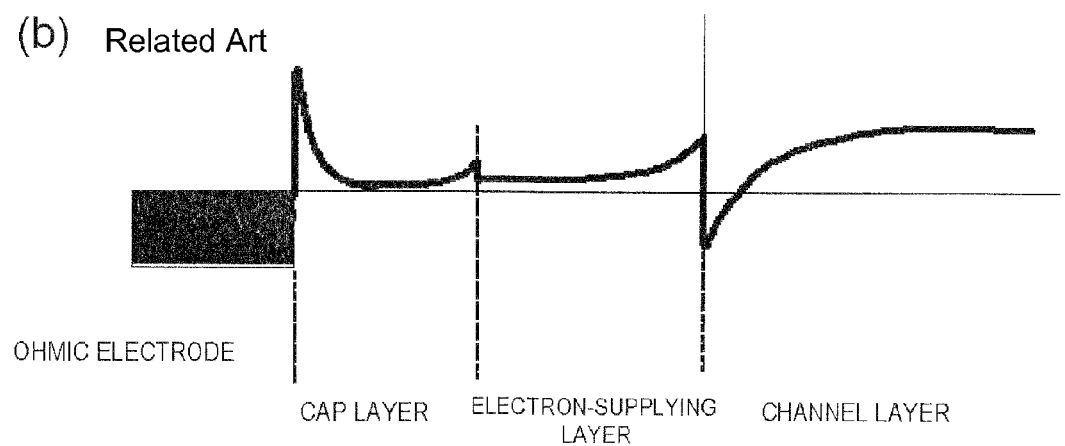

FIG. 8 is a diagram of energy band, showing a distribution of conduction band energy corresponding to ohmic contact in eighth exemplary embodiment. Ordinate represents energy and abscissa represents depth. Abscissa in the left side represents the ohmic electrode, and the right side represents the channel layer. In the present exemplary embodiment, the cap layer 15 and the electron-supplying layer 16 partially have the same composition (that is, z=x) at the interface therebetween. In the present exemplary embodiment, the composition in the lowermost portion of the cap layer 15 is selected to be the same as that of the electron-supplying layer 16, so that no discontinuity is occurred in the conduction band, and therefore no potential barrier is created at the interface of the cap layer 15 and the channel layer 12. In an example assuming a condition of z=x=0.58, a spontaneous polarized charge generated in the cap layer 15 is obtained by substituting z=0.58 into formula (8) as: 0.026 Cm$^{-2}$ (1.61×10$^{13}$ cm$^{-2}$). When the thickness of the cap layer is assumed to be 50 nm, this corresponds to 3.22×10$^{18}$ cm$^{-3}$. A potential distribution of a convex profile from above downward as shown in FIG. 8 is obtained by doping with n-type dopant at a concentration higher than the above-described concentration, so that better ohmic-ability can be achieved.

The invention claimed is:

1. A semiconductor device, comprising:
   a channel layer;
   an electron-supplying layer provided on said channel layer;
   a cap layer, provided on said electron-supplying layer and creating lattice match with said channel layer; and
   an ohmic electrode provided on said cap layer,
   wherein said cap layer has a composition of $(In_yAl_{1-y})_zGa_{1-z}N$ where ($0 \leq y \leq 1$, $0 \leq z \leq 1$),
   wherein a boundary surface between said electron-supplying layer and said cap layer contains at least In, and in said cap layer a ratio of InAlN in the $(In_yAl_{1-y})_zGa_{1-z}N$ decreases from said boundary surface to a side of said cap layer opposite said boundary surface,
   wherein said electron-supplying layer has a composition of $(In_uAl_{1-u})_xGa_{1-x}N$ ($0 \leq u \leq 1$, $0 < x \leq 1$),
   wherein said cap layer creates lattice match with both said channel layer and said electron-supplying layer,
   wherein said semiconductor device further comprises a gate electrode coupled to said electron-supplying layer, said gate electrode constituting a hetero junction field effect transistor, and
   wherein said ohmic electrode functions as a source electrode or a drain electrode of said hetero junction field effect transistor.

2. The semiconductor device as set forth in claim 1, wherein said cap layer and said electron-supplying layer have an identical composition at an interface therebetween.

3. The semiconductor device as set forth in claim 2, wherein said channel layer has a composition of: GaN or $In_tGa_{1-t}N$ ($0 < t \leq 1$).

4. The semiconductor device as set forth in claim 3, wherein a section of an upper surface of said electron-supplying layer without being coupled to said gate electrode is overall covered with said cap layer.

5. The semiconductor device as set forth in claim 4, wherein said cap layer is doped with n-type dopant, which is capable of creating negative charge that is not lower than a spontaneous polarized charge.

6. The semiconductor device as set forth in claim 4, wherein z in said cap layer is selected so that a valence band discontinuity is equal to or lower than an energy level represented by (kT$_{ch}$/q), where k is Boltzmann constant, T$_{ch}$ is 200° C., and q is elementary charge at an interface with said electro-supplying layer.

7. The semiconductor device as set forth in claim 5, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

8. The semiconductor device as set forth in claim 3, wherein said cap layer is doped with n-type dopant, which is capable of creating negative charge that is not lower than a spontaneous polarized charge.

9. The semiconductor device as set forth in claim 8, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

10. The semiconductor device as set forth in claim 3, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

11. The semiconductor device as set forth in claim 2, wherein a section of an upper surface of said electron-supplying layer without being coupled to said gate electrode is overall covered with said cap layer.

12. The semiconductor device as set forth in claim 11, wherein said cap layer is doped with n-type dopant, which is capable of creating negative charge that is not lower than a spontaneous polarized charge.

13. The semiconductor device as set forth in claim 12, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

14. The semiconductor device as set forth in claim 11, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

15. The semiconductor device as set forth in claim 2, wherein said cap layer is doped with n-type dopant, which is capable of creating negative charge that is not lower than a spontaneous polarized charge.

16. The semiconductor device as set forth in claim 15, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

17. The semiconductor device as set forth in claim 2, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

18. The semiconductor device as set forth in claim 1, wherein said channel layer has a composition of: GaN or $In_tGa_{1-t}N$ ($0<t\leq1$).

19. The semiconductor device as set forth in claim 18, wherein a section of an upper surface of said electron-supplying layer without being coupled to said gate electrode is overall covered with said cap layer.

20. The semiconductor device as set forth in claim 19, wherein said cap layer is doped with n-type dopant, which is capable of creating negative charge that is not lower than a spontaneous polarized charge.

21. The semiconductor device as set forth in claim 20, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

22. The semiconductor device as set forth in claim 19, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

23. The semiconductor device as set forth in claim 18, wherein said cap layer is doped with n-type dopant, which is capable of creating negative charge that is not lower than a spontaneous polarized charge.

24. The semiconductor device as set forth in claim 23, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

25. The semiconductor device as set forth in claim 18, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

26. The semiconductor device as set forth in claim 1, wherein a section of an upper surface of said electron-supplying layer without being coupled to said gate electrode is overall covered with said cap layer.

27. The semiconductor device as set forth in claim 26, wherein said cap layer is doped with n-type dopant, which is capable of creating negative charge that is not lower than a spontaneous polarized charge.

28. The semiconductor device as set forth in claim 27, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

29. The semiconductor device as set forth in claim 26, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

30. The semiconductor device as set forth in claim 1, wherein said cap layer is doped with n-type dopant, which is capable of creating negative charge that is not lower than a spontaneous polarized charge.

31. The semiconductor device as set forth in claim 30, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

32. The semiconductor device as set forth in claim 1, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

33. The semiconductor device as set forth in claim 1, wherein a composition of said cap layer is GaN at an interface with said ohmic electrode.

34. The semiconductor device as set forth in claim 1, wherein said channel layer has a composition of $In_tGa_{1-t}N$ ($0<t\leq1$).

35. A semiconductor device, comprising:
a channel layer;
an electron-supplying layer provided on said channel layer;
a cap layer, provided on said electron-supplying layer and creating lattice match with said channel layer; and
an ohmic electrode provided on said cap layer,
wherein said cap layer has a composition of $(In_yAl_{1-y})_zGa_{1-z}N$ where ($0\leq y\leq1$, $0\leq z\leq1$),
wherein a boundary surface between said electron-supplying layer and said cap layer contains at least In, and in said cap layer a ratio of InAlN in the $(In_yAl_{1-y})_zGa_{1-z}N$ decreases from said boundary surface to a side of said cap layer opposite said boundary surface,
wherein said electron-supplying layer has a composition of $(In_uAl_{1-u})_xGa_{1-x}N$ ($0\leq u\leq1$, $0<x\leq1$),
wherein said cap layer creates lattice match with both said channel layer and said electron-supplying layer, and
wherein said cap layer is doped with n-type dopant, which is capable of creating negative charge that is not lower than a spontaneous polarized charge.

36. The semiconductor device as set forth in claim 35, wherein said channel layer has a composition of: GaN or $In_tGa_{1-t}N$ ($0<t\leq1$).

37. The semiconductor device as set forth in claim 36, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

38. The semiconductor device as set forth in claim 35, wherein said cap layer and said electron-supplying layer have an identical composition at an interface therebetween.

39. The semiconductor device as set forth in claim 38, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

40. The semiconductor device as set forth in claim 38, wherein said channel layer has a composition of: GaN or $In_tGa_{1-t}N$ ($0<t\leq1$).

41. The semiconductor device as set forth in claim 38, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

42. The semiconductor device as set forth in claim 35, wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

43. A semiconductor device, comprising:
a channel layer;
an electron-supplying layer provided on said channel layer;
a cap layer, provided on said electron-supplying layer and creating lattice match with said channel layer; and
an ohmic electrode provided on said cap layer,
wherein said cap layer has a composition of $(In_yAl_{1-y})_zGa_{1-z}N$ where ($0\leq y\leq1$, $0\leq z\leq1$),
wherein a boundary surface between said electron-supplying layer and said cap layer contains at least In, and in said cap layer a ratio of InAlN in the $(In_yAl_{1-y})_zGa_{1-z}N$ decreases from said boundary surface to a side of said cap layer opposite said boundary surface,
wherein said electron-supplying layer has a composition of $(In_uAl_{1-u})_xGa_{1-x}N$ ($0\leq u\leq1$, $0<x\leq1$),
wherein said cap layer creates lattice match with both said channel layer and said electron-supplying layer, and
wherein z in said cap layer is selected so that a valence band discontinuity is equal to or lower than an energy level represented by ($kT_{ch}/q$), where k is Boltzmann constant, $T_{ch}$ is 200° C., and q is elementary charge at an interface with said electro-supplying layer.

44. The semiconductor device as set forth in claim 43, wherein said cap layer and said electron-supplying layer have an identical composition at an interface therebetween.

45. The semiconductor device as set forth in claim 44, wherein said channel layer has a composition of: GaN or $In_tGa_{1-t}N$ ($0<t\leq1$).

46. The semiconductor device as set forth in claim 43, wherein said channel layer has a composition of: GaN or $In_tGa_{1-t}N$ ($0<t\leq1$).

* * * * *

UNITED STATES PATENT AND TRADEMARK OFFICE
CERTIFICATE OF CORRECTION

PATENT NO. : 8,525,229 B2  
APPLICATION NO. : 12/299542  
DATED : September 3, 2013  
INVENTOR(S) : Yasuhiro Okamoto et al.

Page 1 of 1

It is certified that error appears in the above-identified patent and that said Letters Patent is hereby corrected as shown below:

In the Claims  
Claim 41, column 12, line 1, "claim 38" should read --claim 40--.

Signed and Sealed this  
Tenth Day of December, 2013

Margaret A. Focarino  
*Commissioner for Patents of the United States Patent and Trademark Office*

UNITED STATES PATENT AND TRADEMARK OFFICE
CERTIFICATE OF CORRECTION

PATENT NO.        : 8,525,229 B2                                                    Page 1 of 1
APPLICATION NO.   : 12/299542
DATED             : September 3, 2013
INVENTOR(S)       : Okamoto et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1086 days.

Signed and Sealed this
Fifteenth Day of September, 2015

Michelle K. Lee
*Director of the United States Patent and Trademark Office*